United States Patent
Heppner et al.

(10) Patent No.: US 9,178,328 B2
(45) Date of Patent: Nov. 3, 2015

(54) SHIELDED SOCKETS FOR MICROPROCESSORS AND FABRICATION THEREOF BY OVERMOLDING AND PLATING

(71) Applicants: Joshua D. Heppner, Chandler, AZ (US); Gaurav Chawla, Tempe, AZ (US)

(72) Inventors: Joshua D. Heppner, Chandler, AZ (US); Gaurav Chawla, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 13/930,090

(22) Filed: Jun. 28, 2013

(65) Prior Publication Data

US 2015/0004813 A1    Jan. 1, 2015

(51) Int. Cl.
| | |
|---|---|
| *H01R 12/00* | (2006.01) |
| *H01R 43/24* | (2006.01) |
| *H01R 13/24* | (2006.01) |
| *H01R 43/16* | (2006.01) |
| *H01L 21/00* | (2006.01) |
| *H01R 12/71* | (2011.01) |
| *H01R 13/405* | (2006.01) |
| *H01R 13/6599* | (2011.01) |
| *H05K 7/10* | (2006.01) |

(52) U.S. Cl.
CPC .............. *H01R 43/24* (2013.01); *H01R 13/245* (2013.01); *H01L 21/00* (2013.01); *H01R 12/716* (2013.01); *H01R 13/405* (2013.01); *H01R 13/6599* (2013.01); *H01R 43/16* (2013.01); *H05K 7/10* (2013.01)

(58) Field of Classification Search
CPC ..................................................... H01R 23/722
USPC ............ 439/66, 931, 607.03, 607.02, 607.01, 439/607.05
See application file for complete search history.

(56) References Cited

U.S. PATENT DOCUMENTS

| | | | | |
|---|---|---|---|---|
| 4,593,961 | A * | 6/1986 | Cosmo ........................... | 439/66 |
| 6,012,929 | A * | 1/2000 | Matsumura ..................... | 439/70 |
| 6,264,476 | B1 * | 7/2001 | Li et al. .......................... | 439/66 |
| 7,503,768 | B2 * | 3/2009 | Tutt et al. ........................ | 439/66 |
| 8,025,531 | B1 * | 9/2011 | Zhang et al. ............. | 439/607.05 |
| 8,821,188 | B2 * | 9/2014 | Chang et al. ............. | 439/607.01 |
| 8,851,904 | B2 * | 10/2014 | Chang et al. .................... | 439/71 |

* cited by examiner

*Primary Examiner* — Phuong Dinh
(74) *Attorney, Agent, or Firm* — Blakely, Sokoloff, Taylor & Zafman LLP (57) ABSTRACT

Shielded sockets for microprocessors and fabrication of shielded sockets by overmolding and plating techniques are described. In an example, a socket for a packaged semiconductor device includes a plastic housing having walls surrounding a cavity. A plurality of contact strips is disposed in the cavity and supported by one or more of the walls of the plastic housing. Each of the plurality of contact strips includes a plurality of contacts. Each of the plurality of contacts includes a vertical region overmolded with plastic, a contact portion, and a J-lead portion. The plastic is coated with a metal layer.

14 Claims, 10 Drawing Sheets

SHIELDED SOCKETS FOR MICROPROCESSORS AND FABRICATION THEREOF BY OVERMOLDING AND PLATING

TECHNICAL FIELD

Embodiments of the invention are in the field of integrated circuits and, in particular, shielded sockets for microprocessors and fabrication of shielded sockets by overmolding and plating techniques.

BACKGROUND

A central processing unit (CPU) socket or CPU slot is a mechanical component that provides mechanical and electrical connections between a microprocessor and a printed circuit board (PCB). This allows the CPU to be replaced without soldering.

Common sockets have retention clips that apply a constant force, which must be overcome when a device is inserted. For chips with a large number of pins, either zero insertion force (ZIF) sockets or land grid array (LGA) sockets are used instead. These designs apply a compression force once either a handle (for ZIF type) or a surface plate (LGA type) is put into place. The surface plate may be referred to as an integrated loading mechanism (ILM). The designs provide superior mechanical retention while avoiding the risk of bending pins when inserting the chip into the socket.

CPU sockets are used in desktop and server computers. As they allow easy swapping of components, they are also used for prototyping new circuits. Laptops typically use surface mount CPUs, which need less space than a socketed part.

A conventional CPU socket is made of plastic, a lever or latch, and metal contacts for each of the pins or lands on the CPU. Many packages are keyed to ensure the proper insertion of the CPU. CPUs with a pin grid array (PGA) package are inserted into the socket and the latch is closed. CPUs with an LGA package are inserted into the socket, the latch plate is flipped into position atop the CPU, and the lever is lowered and locked into place, pressing the CPU's contacts firmly against the socket's lands and ensuring a good connection, as well as increased mechanical stability.

However, improvements are needed in the field of integrated circuit (IC) socket technology, particular for high end microprocessor applications.

DESCRIPTION OF THE EMBODIMENTS

Shielded sockets for microprocessors and fabrication of shielded sockets by overmolding and plating techniques are described. In the following description, numerous specific details are set forth, such as ordering of process operations used to fabricate a shielding socket, in order to provide a thorough understanding of embodiments of the present invention. It will be apparent to one skilled in the art that embodiments of the present invention may be practiced without these specific details. In other instances, well-known features, such as specific semiconductor packaging processes, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to shielded socket fabrication as enabled by innovative overmolding and plating processing. Embodiments may pertain to one or more of shielded sockets, high speed input/output (HSIO), overmolding, plating, server products, and/or high performance computing (HPC) products.

To provide context, socket pin count demand is increasing as a result of higher bandwidth requirements, leading to larger form factor (FF) and higher cost. A shielded socket is one solution to enable higher density of I/O contacts and improved HSIO performance. If all sockets could be shielded, then speeds may be increased without risk of lossy signals. However, although such shielding may be desirable, it can be very difficult to manufacture such a socket. Past approaches evaluated thus far that provide the target mechanical and electrical performance have suffered from manufacturing and common grounding challenges. Many past solutions have proven complex and costly.

Generally, embodiments described herein are directed to fabricating a socket body by assembling repeating plastic structures, as over-molded on strips of contacts, into socket housing. In one embodiment, the repeating plastic structures have a metal coating on the outer walls, and contact one another at multiple locations at intervals of half the contact pitch value, in order to enable common grounding. It is, however, to be understood that the design is not limited to being one half pitch off. One half pitch is shown and described herein to illustrate a hexagonal pattern, as described in greater detail herein. In one embodiment, the contact strips have carrier arms attached to thereto, which facilitate assembling of the plastic structures in the housing. In one embodiment, shielding is maintained for maximum stack height and at a full 360 degrees.

More specifically, in an embodiment, shielding is built into a structure that is to be inserted into a socket housing. Shielding may be provided approximately 360 degrees around the contact closely approximating a coaxial cable. In an embodiment, an easier manufacturing approach is described for providing a socket body. In an embodiment, the same contact design is used for signal and ground. The difference is that the ground contacts are connected to a conductive coating. In an embodiment, designs described herein take advantage of existing cantilever contacts and accommodates the contacts in a shielded space, simplifying the manufacturability. In an embodiment, fabrication involves use of overmolding to reduce the tooling cost and time by reducing the large tooling otherwise required to fabricate a full socket body to tooling required to fabricate a strip of contacts. In a specific embodiment, in cases where requirements of a shielded socket dictate such, the contacts are laid out in a 39 mil Hex pattern.

Figure 1:
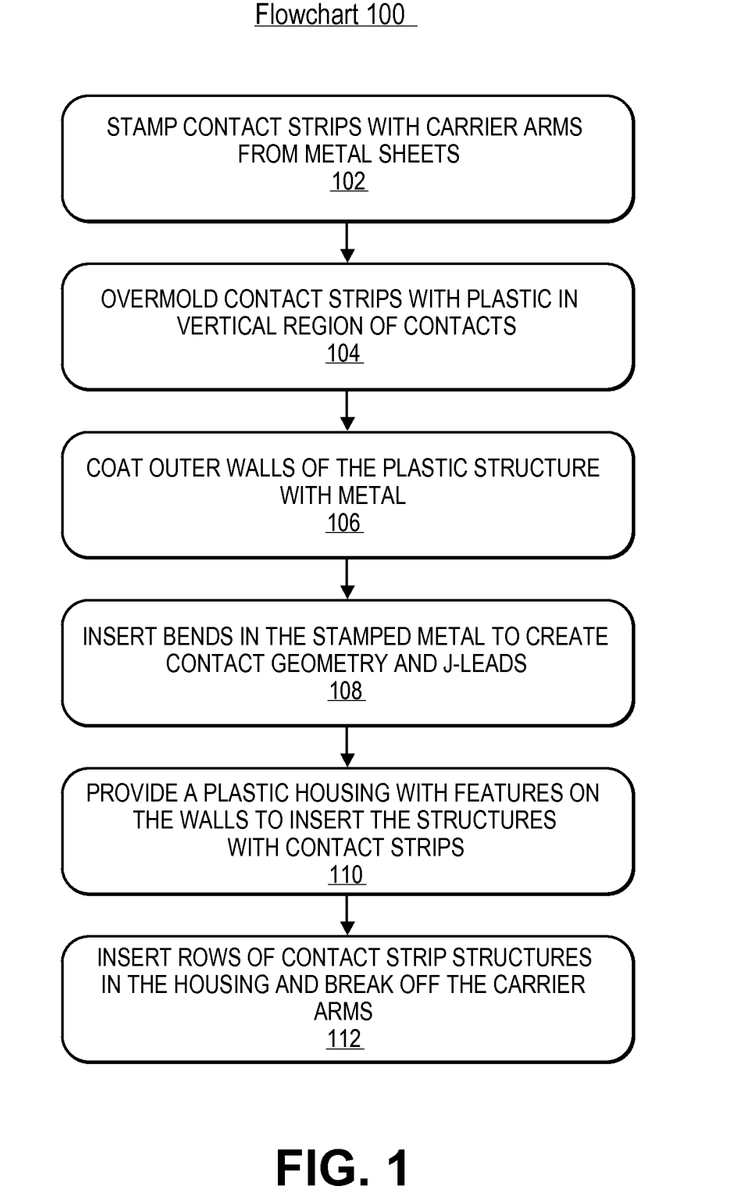
FIG. 1 is a flowchart representing operations in a method of manufacturing a shielded socked, in accordance with an embodiment of the present invention.

As an example, FIG. 1 is a flowchart 100 representing operations in a method of manufacturing a shielded socked, in accordance with an embodiment of the present invention.

Figure 2A:
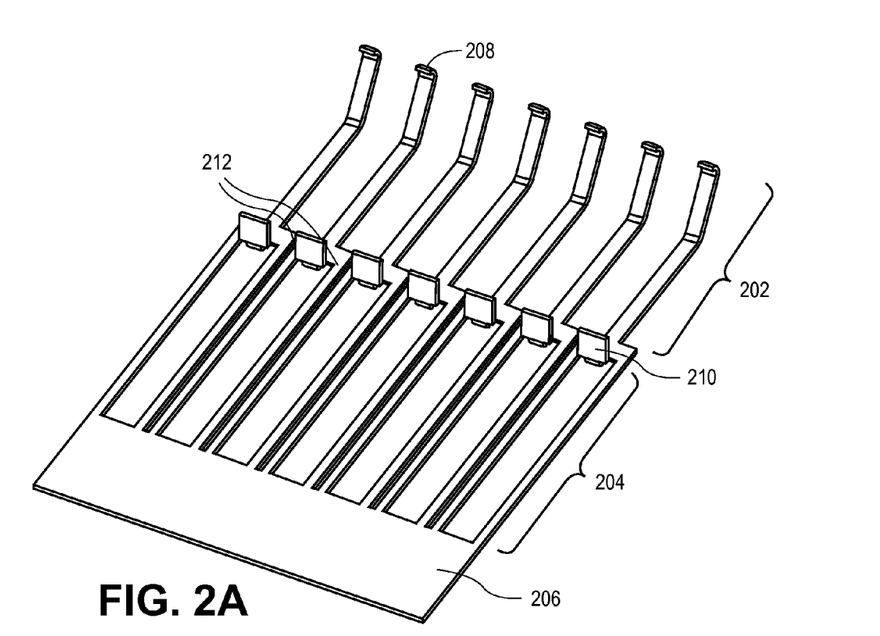
FIG. 2A illustrates an angled top-down plan view of contact strips with carrier arms from a carrier, as stamped from metal sheets, in accordance with an embodiment of the present invention.
Figure 2B:
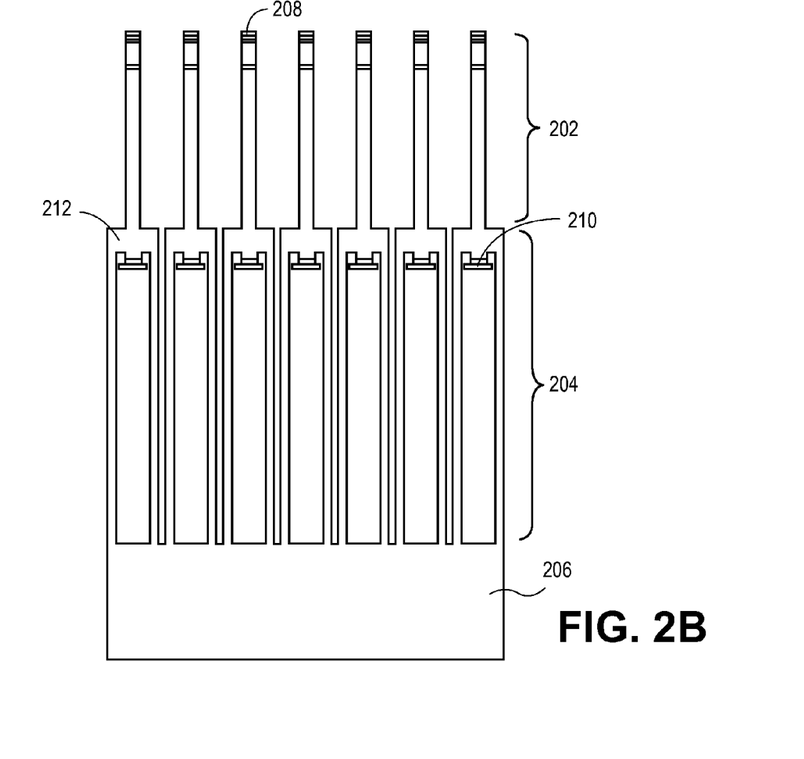
FIG. 2B illustrates a top-down plan view of contact strips with carrier arms from a carrier, as stamped from metal sheets, in accordance with an embodiment of the present invention.

Referring to operation 102 of flowchart 100, contact strips with carrier arms are stamped from metal sheets. As an example, FIGS. 2A and 2B illustrate an angled top-down plan view and a top-down plan view, respectively, of contact strips 202 with carrier arms 204 from a carrier 206, as stamped from metal sheets, in accordance with an embodiment of the present invention. Each of the contact strips 202 includes a contact tip region 208 and a J-lead region 210. Each of the carrier arms 204 includes a break-off point 212. In an embodiment, fabrication of a shielded socket begins with a metal sheet and stamp out of a base geometry (e.g., before inserting bends) of contacts. The base geometry can be a strip carrying multiple contacts and carrier arms, as shown in FIGS. 2A and 2B. In one embodiment, the number of contacts on the strip will be such that it covers the socket housing from one end across to the other, as described in greater detail below. It is to be understood that, generally, the bottom of the J-lead ultimately receives a solder ball during a socket process and is attached to the mother board. Corresponding cantilever beams are in contact with the package.

Figure 3A:
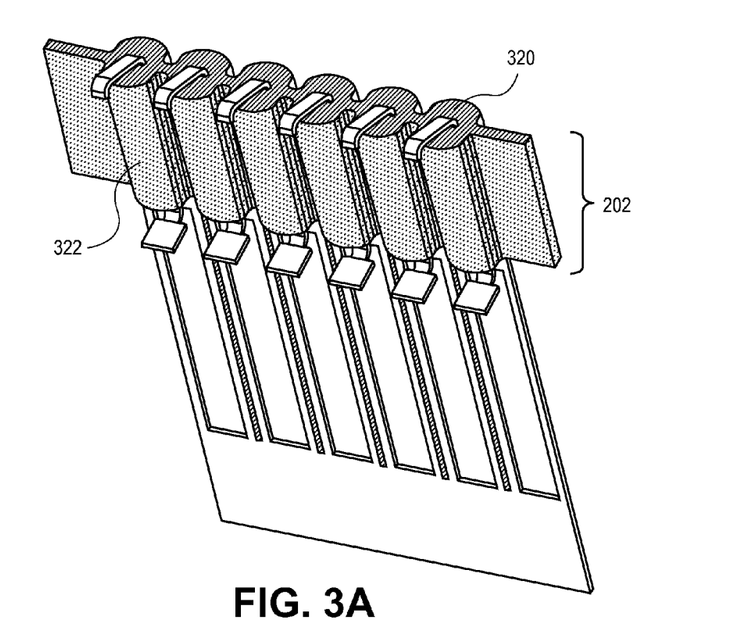
FIG. 3A illustrates an angled top-down plan view of contact strips overmolded with a plastic coating in a vertical region of the contacts strips, with metal plated on the plastic coating, in accordance with an embodiment of the present invention.
Figure 3B:
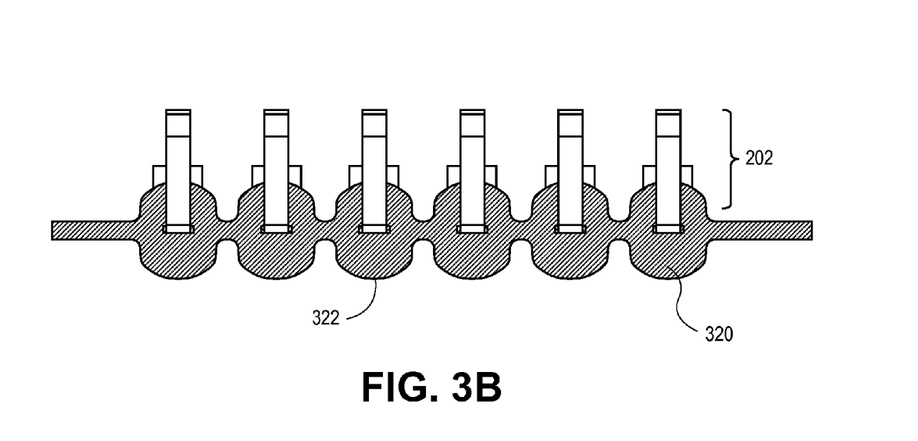
FIG. 3B illustrates an end-on (from a contact perspective) view of contact strips overmolded with a plastic coating in a vertical region of the contacts strips, with metal plated on the plastic coating, in accordance with an embodiment of the present invention.

Referring to operation 104 of flowchart 100, the contact strips of operation 102 are overmolded with plastic in a vertical region of the contacts. As an example, FIGS. 3A and 3B illustrate an angled top-down plan view and an end-on (from a contact perspective) view, respectively, of contact strips 202 overmolded with a plastic coating 320 in a vertical region of the contacts strips, with metal plated on the plastic coating, in accordance with an embodiment of the present invention. In one embodiment, as depicted in FIGS. 3A and 3B, the plastic coating 320 has an undulating shape. It is to be understood that, in an embodiment, an undulating geometry may be applicable for hexagonal pitches. Additionally, squares, triangles, polygons, etc. may be used for square or other patterns. In a particular embodiment, the plastic molding 320 is composed of a liquid crystal polymer (LCP) material. It is to be understood that other similar plastic molding materials may be equally applicable.

Referring to operation 106 of flowchart 100, the outer walls of the plastic are coated with a metal layer. Referring again to FIGS. 3A and 3B, a metal coating 322 is formed on the exposed surfaces of the plastic coating 320. In an embodiment, then, a plastic structure is overmolded onto the contact strips, and metal is coated on the outer walls of the plastic structure. The approach of depositing metal on the exterior of the plastic enables, in an embodiment, cost effective methods of plating and allows better uniformity as the plating is not occurring in high aspect ratio cavities with poor line of sight. As discussed in greater detail below, in one embodiment, multiple plastic structures with contact strips can then be inserted in a socket housing adjacent to each other to populate the socket core depending on the required number of contacts. In a particular embodiment, metal coating 322 is a plated copper layer. It is to be understood that other like conductive layers, such as gold or silver layers may be equally applicable.

Referring to operation 108 of flowchart 100, bends are inserted in the stamped metal to create the contact geometry (e.g., contact tips 208) and J-leads 210. It is noted that the bends are shown as formed prior to overmolding (FIGS. 2A/2B and FIGS. 3A/3B), in accordance with one embodiment. However, in another embodiment, the bends (e.g., contact tips 208 and J-leads 210) are formed subsequent to plastic coating overmolding or subsequent to plastic coating overmolding and metal coating plating.

Figure 4:
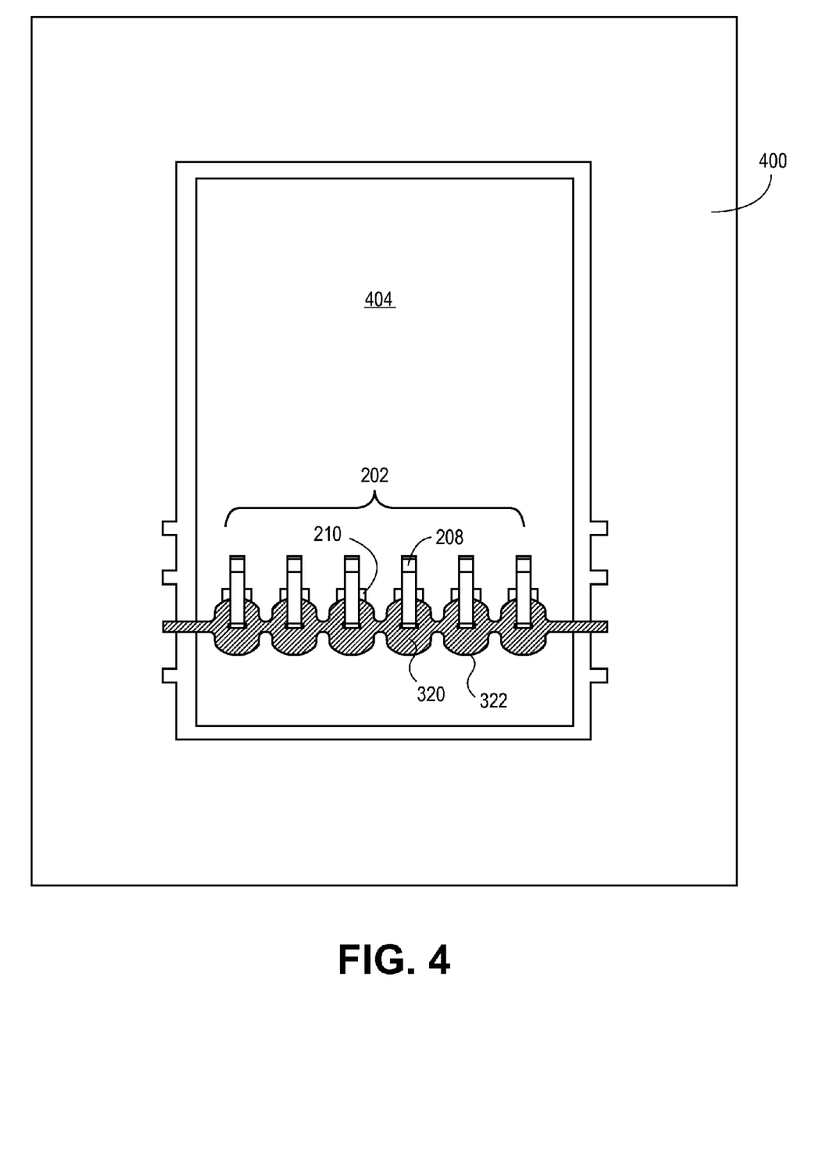
FIG. 4 illustrates a top-down plan view of a plastic housing having wall features for inserting structures with contact strips within a cavity of the plastic housing, in accordance with an embodiment of the present invention.

Referring to operation 110 of flowchart 100, a plastic housing is provided with wall features for inserting structures with contact strips. As an example, FIG. 4 illustrates a top-down plan view of a plastic housing 400 having wall features for inserting structures with contact strips within a cavity 404 of the plastic housing 400, in accordance with an embodiment of the present invention.

Referring to operation 112 of flowchart 100, one or more rows of contact strip structures are inserted in the housing. Referring again to FIG. 4, one row of contact strips 202, having plastic coating 320 and metal coating 322 thereon is inserted into the cavity 404 of plastic housing 400 and supported by wall features (as seen more readily in the angled view of FIG. 6). Additionally, as is also shown in FIG. 4, the carrier 206 and carrier arms 204 are removed from the contact strips 202 by releasing the carrier 206 and carrier arms 204 at the break-off points 212. The remaining contact strips 202 include the contact tip regions 208 and the J-lead regions 210, as depicted in FIG. 4. Although, in one embodiment, the carrier 206 and carrier arms 204 are removed subsequent to inserting the contact strips into the housing 400, in another embodiment, the carrier 206 and carrier arms 204 are removed prior to inserting the contact strips into the housing 400. In a particular embodiment, the housing 400 has locking features on the base periphery to hold the contact strip structures in place.

Figure 5:
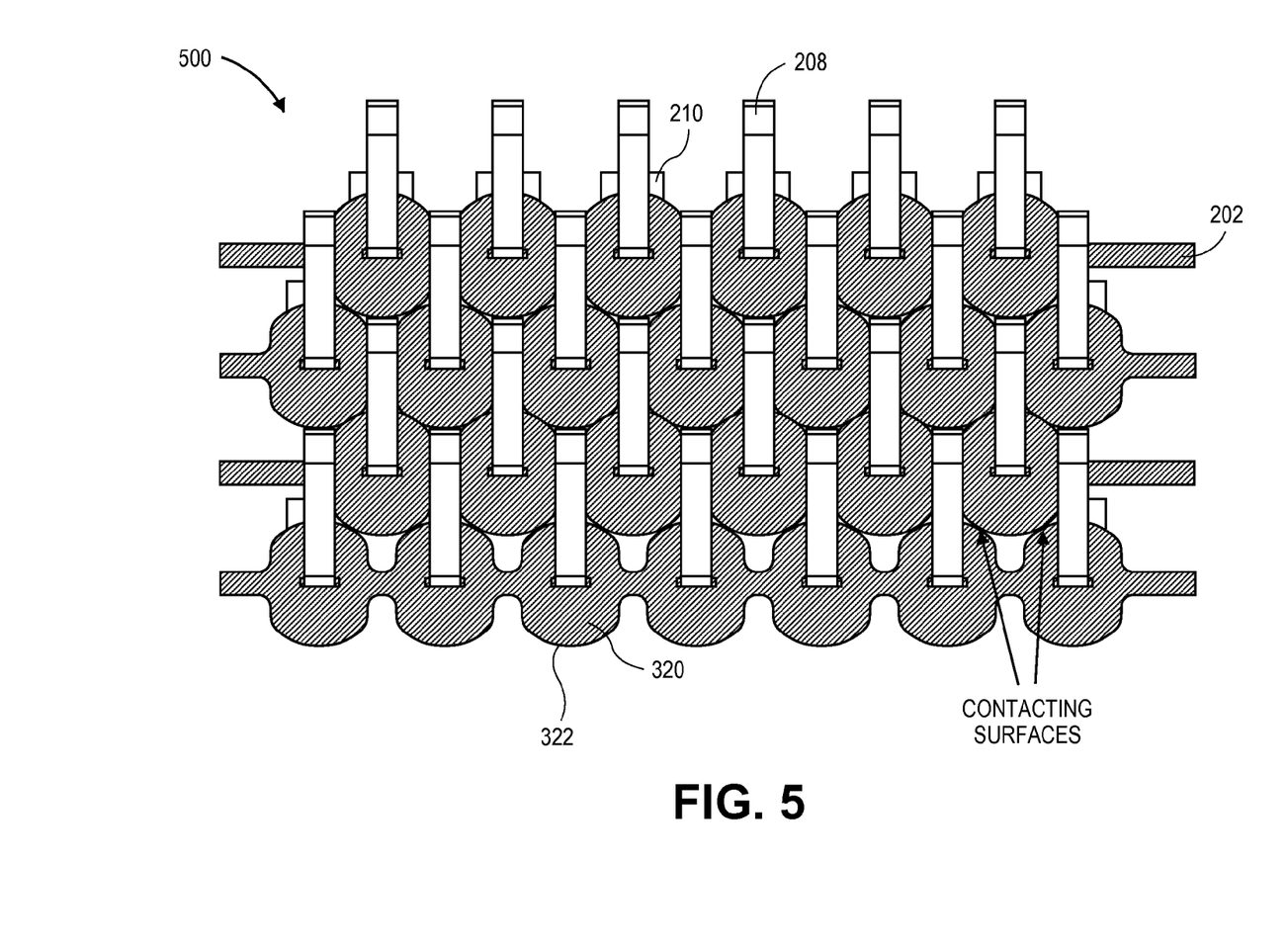
FIG. 5 illustrates an end-on (from a contact overlying J-leads perspective) view of a plurality contact strips overmolded with a plastic coating, with metal plated on the plastic coating, in accordance with an embodiment of the present invention.

In an embodiment, a purpose of the metal-coated plastic structure described above is two-fold: (1) to provide a robust casing around the contact strips 202 that can be aligned and inserted into the insertion features on the housing 400, as depicted in FIG. 4; and (2) the dimensions are selected such that the metal-coated walls touch the walls of the adjacent contact strip structure, enabling common ground throughout the a resulting socket structure. As an example, FIG. 5 illustrates an end-on (from a contact 202 overlying J-leads 210 perspective) view of a plurality 500 contact strips 202 overmolded with a plastic coating 320, with metal 322 plated on the plastic coating, in accordance with an embodiment of the present invention. Referring to FIG. 5, the contacting outer walls of adjacent contact strips structures 202 provides common grounding).

In an embodiment, the dimension of the socket to which the contact strips are aligned is selected based on a target to achieve maximum distance between two contacts in a hexagonal layout. Such an arrangement minimizes the risk of shorting the contacts when they are in a deflected state. As can be viewed in FIG. 5, if the contacts were to be rotated by 90 degrees, the distance between adjacent contacts in the direction of wipe will be smaller than the shown configuration. In an embodiment, the contact strip structures 202 are aligned with the alignment features on the housing and press fit into the housing, e.g., housing 400.

Figure 6:
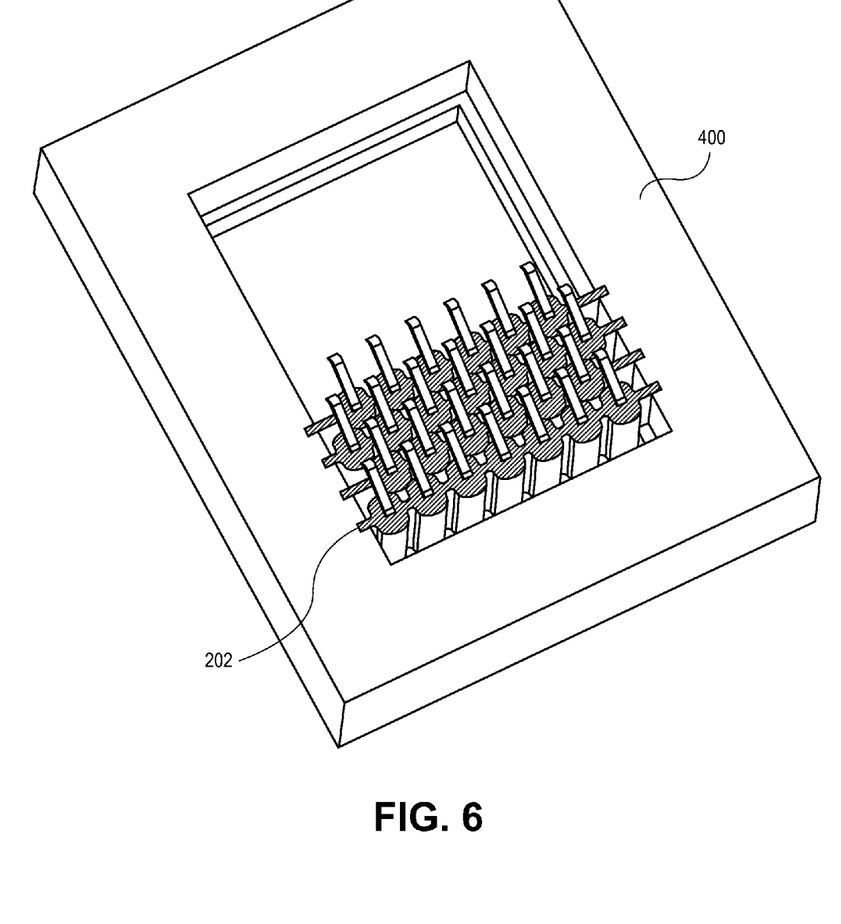
FIG. 6 illustrates an angled top-down view of a socket housing having a plurality of contact strips disposed therein, in accordance with an embodiment of the present invention.

An arrangement such as the arrangement shown in FIG. 5 may be used for a plurality of strips in a housing such as housing 400. As a partially completed example, FIG. 6 illustrates an angled top-down view of a socket housing 400 having a plurality of contact strips 202 disposed therein, in accordance with an embodiment of the present invention. Referring to FIG. 6, the plurality of contact strips 202 has a hexagonal arrangement, as described in association with FIG. 5. It is to be understood that the structure of FIG. 6 is an incomplete socket structure. A complete socket structure includes, in one embodiment, an entirely packed plurality of contact strips 202 in housing 400. In any case, referring again to FIG. 6, separate ground contacts are not required since all contacts are the same at fabrication. Subsequent to completing fabrication of the socket structure, a determination can be made as to which contacts will be grounded.

In accordance with one or more embodiments of the present invention, advantages of the above described shielded socket designs include one or more of: (1) feasibility for manufacturing with conventional resources; (2) utilization of a cantilever contact design; (3) housing fabricated without conventional stiff housing, and due to the design of the contact strip structures, additional compliance on the solder joint side (potentially reducing risk of shock failure; (4) for the ground contacts, top surfaces of the plastic structures can be plated as well, providing connection to other conducting surfaces; (5) improved control over plating uniformity; (6) scalable solutions; (7) the contact strips can readily be slid in to larger/smaller housings of a same width; and/or (8) reduced tooling costs (e.g., full socket tooling is reduced to tooling for contact strips which are then molded multiple times to populate a socket body).

Figure 7:
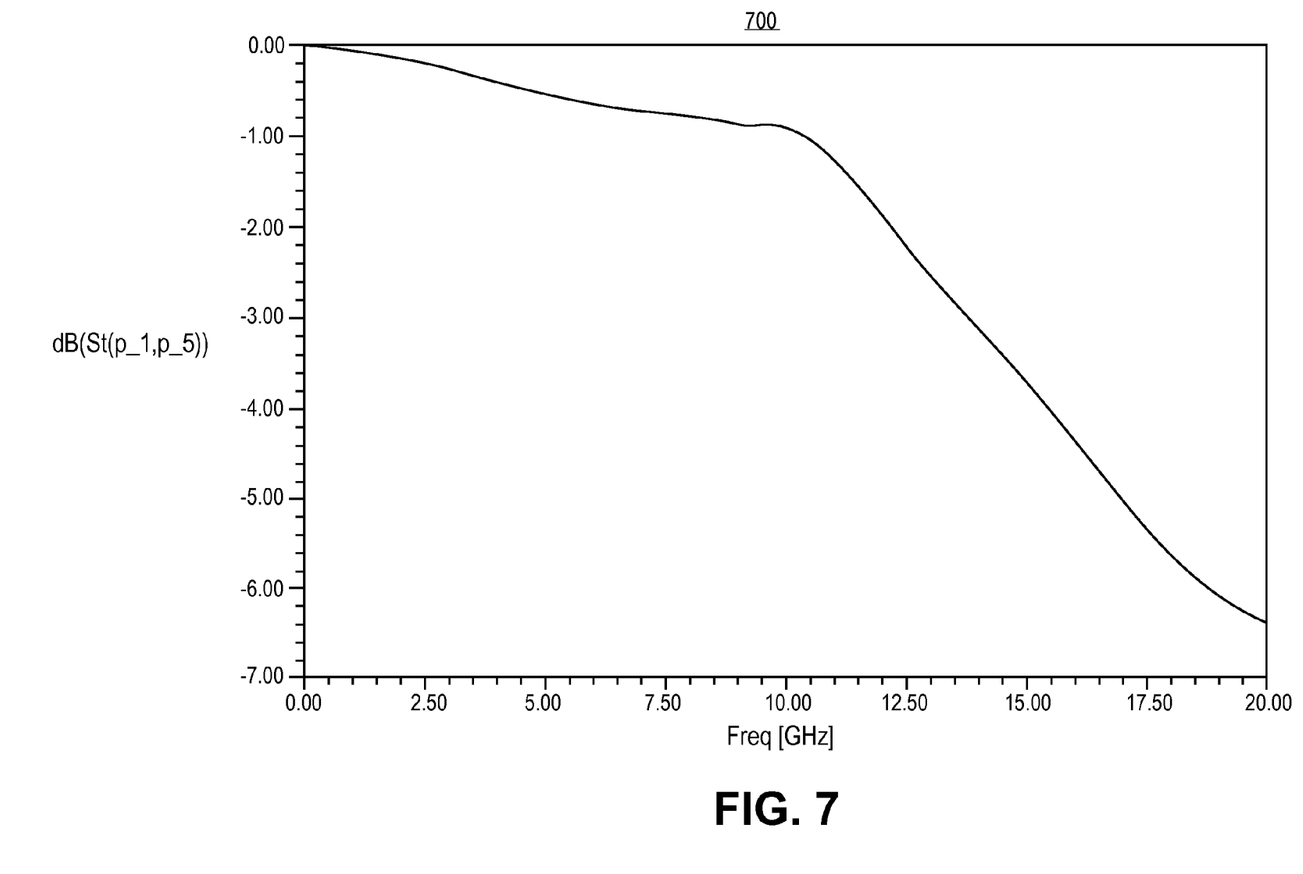
FIG. 7 includes a plot showing insertion loss as a function of frequency for a single contact or pin in a shielded socket, in accordance with an embodiment of the present invention.
Figure 8:
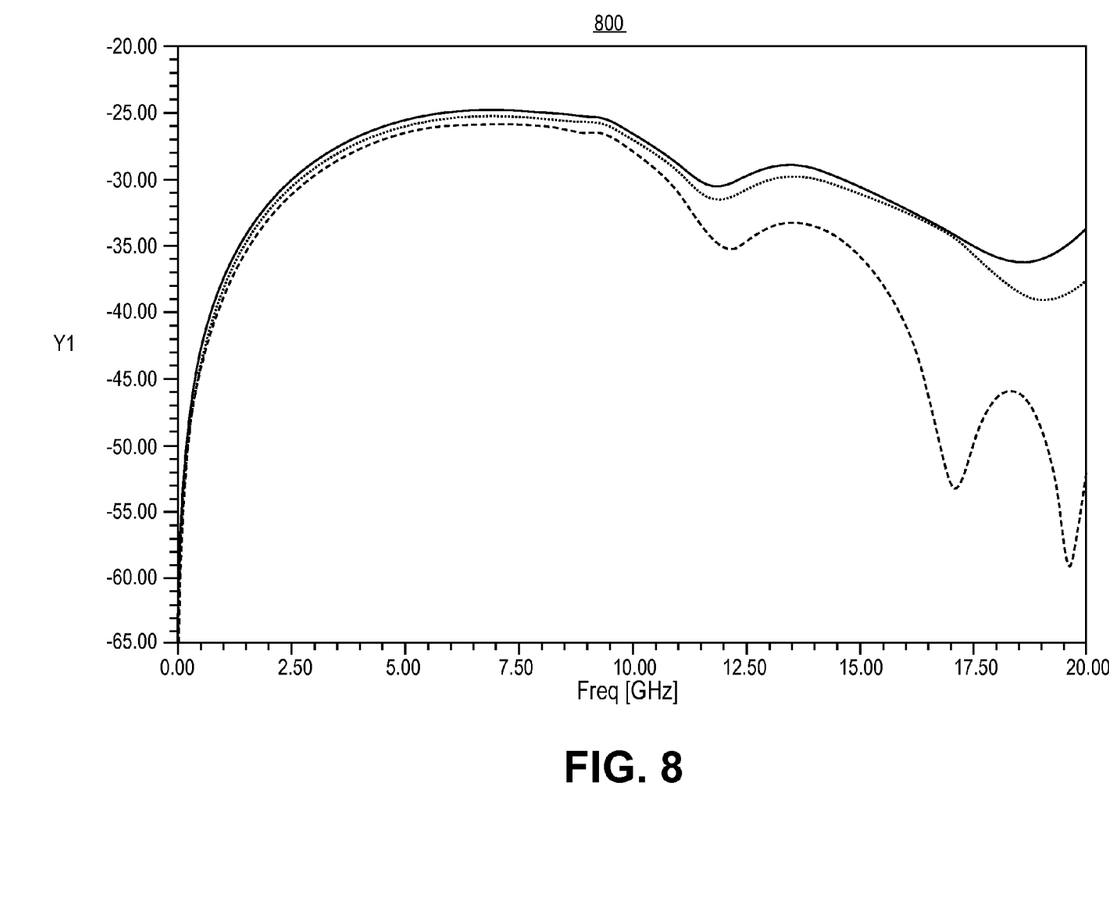
FIG. 8 includes a plot showing near end cross talk (NEXT) as a function of frequency for a set of four contacts or pins in a shielded socket, in accordance with an embodiment of the present invention.
Figure 9:
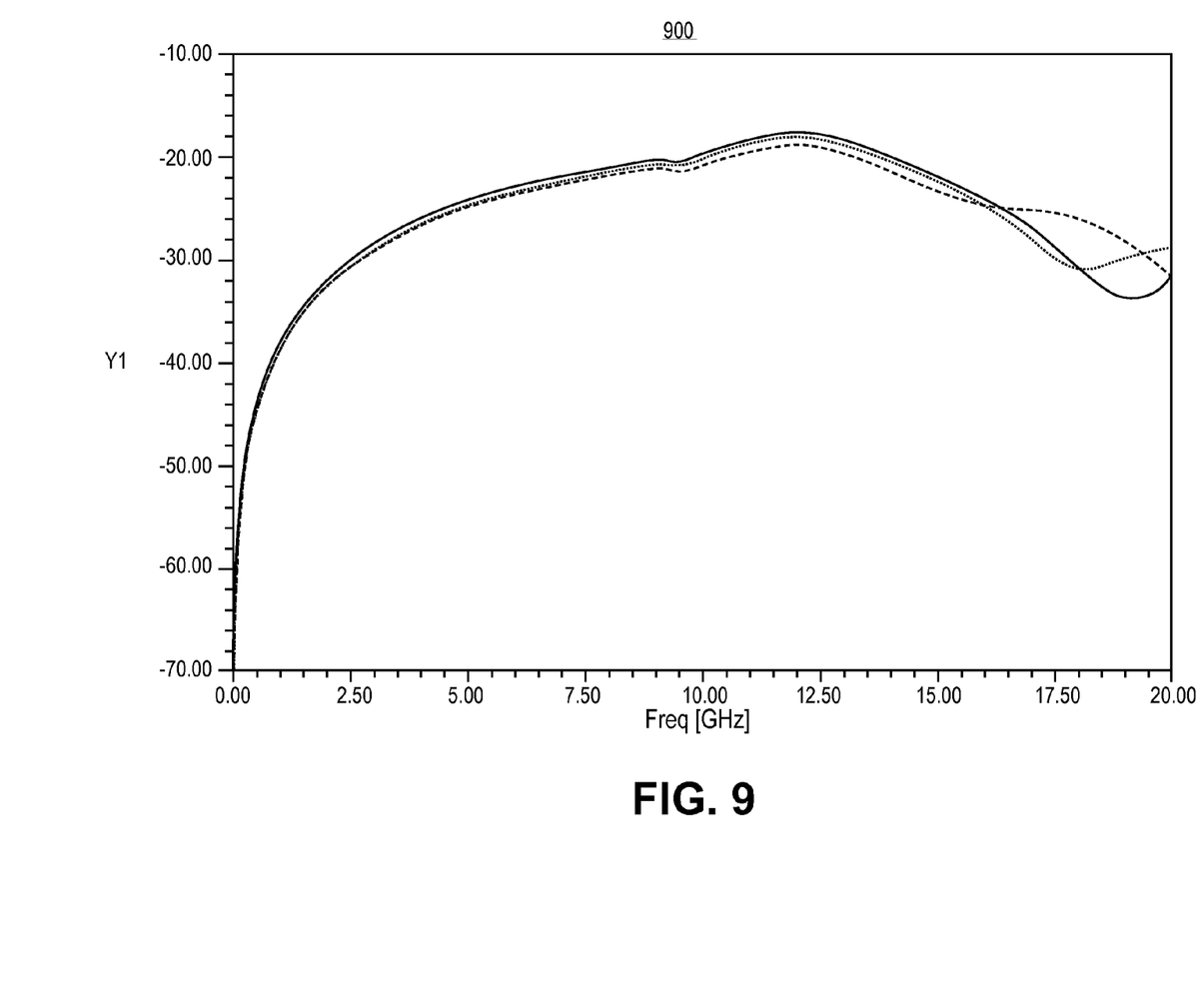
FIG. 9 includes a plot showing far end cross talk (FEXT) as a function of frequency for a set of four contacts or pins in a shielded socket, in accordance with an embodiment of the present invention.

One or more, embodiments of the present invention have been evaluated using computer assisted design (CAD) tools. Additionally HSIO modeling has been completed on one or more of the designs described herein. More specifically, insertion loss, near end cross talk and far end cross talk are plotted in FIGS. 7, 8, and 9, respectively. FIG. 7 includes a plot 700 showing insertion loss as a function of frequency for a single contact or pin (one unit within a strip) in a shielded socket, in accordance with an embodiment of the present invention. FIG. 8 includes a plot 800 showing near end cross talk (NEXT) as a function of frequency for a set of four contacts or pins in a shielded socket, in accordance with an embodiment of the present invention. FIG. 9 includes a plot 900 showing far end cross talk (FEXT) as a function of frequency for a set of four contacts or pins in a shielded socket, in accordance with an embodiment of the present invention. Overall, electrical results show improved performance over conventional socket designs.

Embodiments described herein may have far reaching implementations for, e.g., shielding improvement and/or signal speed increases for an integrated circuit housed in a shielded socket. Applications for a shielded socket described herein may include, but need not be limited to, socket applications for CPUs/processors, multi-chip/3D packaging including CPU in combination with other devices, memory (e.g., flash/DRAM/SRAM), graphics, etc. Overall, one or more embodiments provide one or more of an increased number of I/O contacts in a same form factor, scalability for various products, improved high speed input/out (HSIO) performance in socketed packages, and/or reduced package size due to reduction of ground pins necessary for shielding signal pins (e.g., signal to ground ratio increase).

It is to be understood that a variety of package types (e.g., packaging arrangements for a semiconductor die) may be accommodated by one or more of the shielded sockets described herein. In an embodiment, conductive features from a package substrate of a semiconductor package are used to physically couple the semiconductor package and, hence, electrically couple the packaged die or dies, to the J-leads of the shielded socket. Typically, sockets are used with land grid array (LGA) or pin grid array (PGA) packages. In the case of LGA, the package can have gold plated lands (e.g., where lands are regions where the contact can touch down upon). It is also to be understood that, as used throughout, J-leads are typically on the side of the contact that touches the board. The side of the contact that touches the packages is most commonly referred to as the cantilever or even contact.

In a first example, in accordance with an embodiment of the present invention, a die is coupled to a flexible substrate or a rigid substrate, depending upon the specific application. The substrate has a plurality of electrical traces disposed therein. In an embodiment, an external contact layer is also formed. In an embodiment, the external contact layer includes an array such as, but not limited to, a land grid array (LGA) or an array of pins (PGA). In any case, the external array is coupled to the J-leads of the shielded socket.

In a second example, in accordance with another embodiment of the present invention, a semiconductor die with C4 solder ball connections is packaged in a Bumpless Build-Up Layer or BBUL processor packaging technology. Such a process is bumpless since it does not use the usual tiny solder bumps to attach the silicon die to the processor package wires. It has build-up layers since it is grown or built-up around the silicon die. Additionally, some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers. In an embodiment, an external contact layer is formed. In an embodiment, the array of external conductive contacts is an array such as, but not limited to, a land grid array (LGA) or an array of pins (PGA). In any case, the external array is coupled to the J-leads of the shielded socket.

Figure 10:
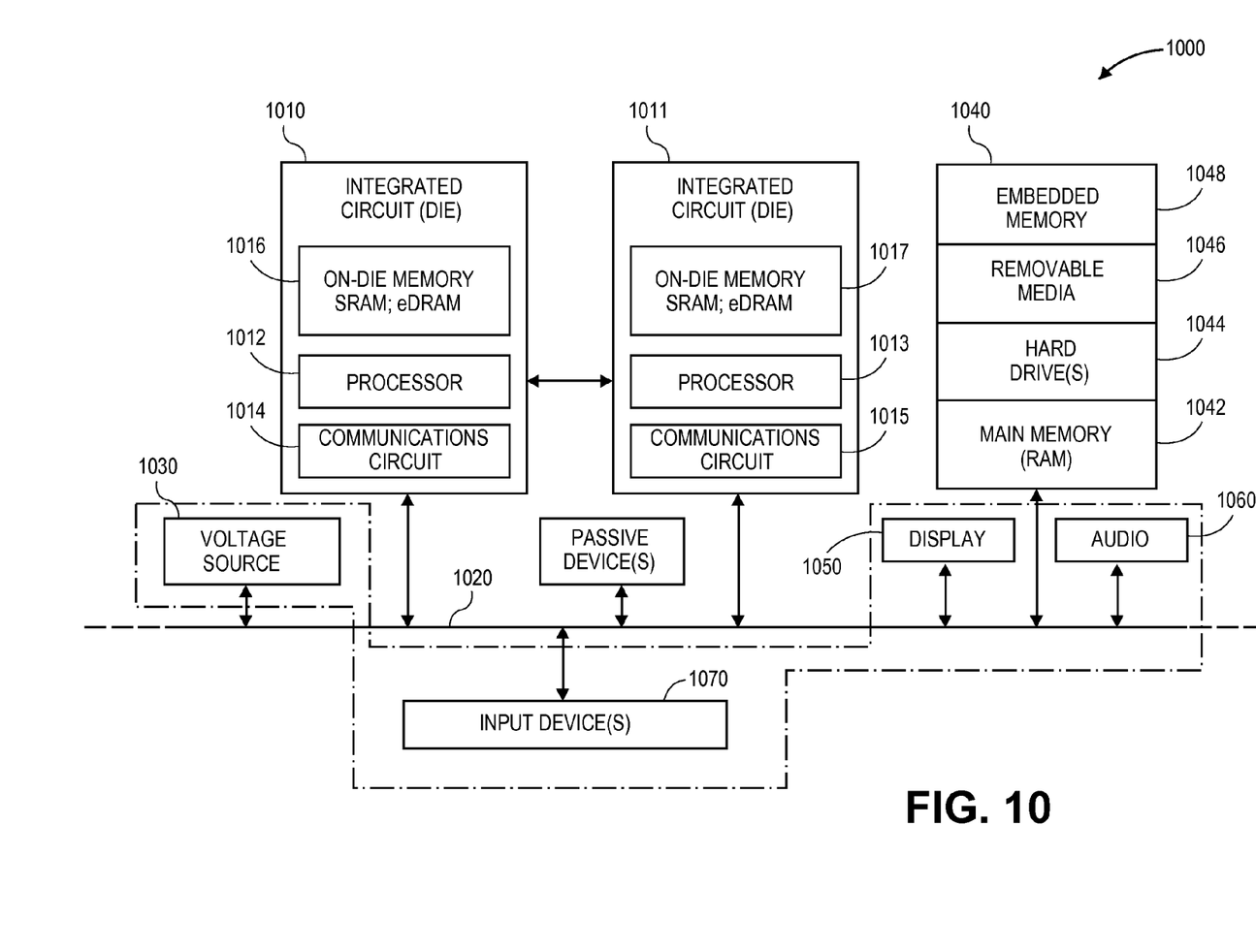
FIG. 10 is a schematic of a computer system, in accordance with an embodiment of the present invention.

FIG. 10 is a schematic of a computer system 1000, in accordance with an embodiment of the present invention. The computer system 1000 (also referred to as the electronic system 1000) as depicted can embody a shielded socket housing a packaged semiconductor die according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to an integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 is a packaged die housed in a shielded socket, as disclosed herein. In an embodiment, SRAM cells are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including in a shielded socket housing a packaged semiconductor die, according to any of the several disclosed embodiments and their equivalents, an electronic system, a computer system, one or more methods of fabricating an integrated circuit, and one or more methods of fabricating an electronic assembly that includes a shielded socket housing a packaged semiconductor die according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a semiconductor package and housed in a shielded socket embodiments and their equivalents. A foundation substrate may be included, as represented by the dashed line of FIG. 10. Passive devices may also be included, as is also depicted in FIG. 10.

Embodiments of the present invention include shielded sockets for microprocessors and fabrication of shielded sockets by overmolding and plating techniques.

In an embodiment, a socket for a packaged semiconductor device includes a plastic housing having walls surrounding a cavity. A plurality of contact strips is disposed in the cavity and supported by one or more of the walls of the plastic housing. Each of the plurality of contact strips includes a plurality of contacts. Each of the plurality of contacts includes a vertical region overmolded with plastic, a contact portion, and a J-lead portion. The plastic is coated with a metal layer.

In one embodiment, the plastic overmolded on each of the plurality of contacts is a liquid crystal polymer (LCP).

In one embodiment, the metal coated on the plastic is copper.

In one embodiment, the plurality of contact strips forms a hexagonal array within the plastic housing, and each of the plurality of contact strips is in contact with an adjacent contact strip through the metal layer of the respective contact strip.

In one embodiment, each of the plurality of contact strips is supported the by wall features of the plastic housing.

In an embodiment, a method of fabricating a shielded socket for a packaged semiconductor device involves stamping one or more contact strips from a metal sheet, each contact strip including a plurality of contacts attached to a carrier by carrier arms. The method also involves overmolding, with plastic, a vertical region of each of the plurality of contacts of each of the one or more contact strips. The method also involves coating the plastic with a metal layer. The method also involves forming bends in each of the plurality of contacts of each of the one or more contact strips to provide a contact tip and a J-lead in each of the plurality of contacts of each of the one or more contact strips. The method also involves removing the carrier and carrier arms from each of the one or more contact strips. The method also involves inserting the one or more contact strips in a plastic housing.

In one embodiment, overmolding, with plastic, the vertical region of each of the plurality of contacts of each of the one or more contact strips involves overmolding using a liquid crystal polymer (LCP).

In one embodiment, coating the plastic with the metal layer involves plating copper on the plastic.

In one embodiment, inserting the one or more contact strips in the plastic housing involves forming a hexagonal array of contact strips within the plastic housing, each contact strip of the hexagonal array of contact strips in contact with an adjacent contact strip through the metal layer of the respective contact strip.

In one embodiment, forming bends in each of the plurality of contacts of each of the one or more contact strips is performed subsequent to the overmolding, with plastic, the vertical region of each of the plurality of contacts of each of the one or more contact strips.

In one embodiment, forming bends in each of the plurality of contacts of each of the one or more contact strips is performed prior to the overmolding, with plastic, the vertical region of each of the plurality of contacts of each of the one or more contact strips.

In one embodiment, removing the carrier and carrier arms from each of the one or more contact strips is performed subsequent to inserting the one or more contact strips in the plastic housing.

In one embodiment, inserting the one or more contact strips in a plastic housing involves supporting the one or more contact strips by wall features of the plastic housing.

In one embodiment, the method further involves, subsequent to inserting the one or more contact strips in the plastic housing, electrically grounding one or more contacts of one or more of the contact strips.

In one embodiment, inserting the one or more contact strips in the plastic housing provides a shielded socket, and the method further involves coupling a packaged semiconductor device to the shielded socket by attaching metal lands of the packaged semiconductor device to the contact tips.

In an embodiment, a contact strip for a shielded socket includes a plurality of contacts. Each of the plurality of contacts includes a vertical region overmolded with plastic, the plastic coated with a metal layer. Each of the plurality of contacts also includes a contact portion and a J-lead portion. The plurality of contacts is unified by the plastic of each of the plurality of contacts.

In one embodiment, the plastic of each of the plurality of contacts of the contact strip has a unified undulating geometry.

In one embodiment, the plastic overmolded on each of the plurality of contacts is a liquid crystal polymer (LCP).

In one embodiment, the metal coated on the plastic is copper.

In an embodiment, an electronics apparatus includes a socket. The socket includes a plastic housing having walls surrounding a cavity. A plurality of contact strips is disposed in the cavity and supported by one or more of the walls of the plastic housing. Each of the plurality of contact strips includes a plurality of contacts. Each of the plurality of contacts includes a vertical region overmolded with plastic, a contact portion, and a J-lead portion. The plastic is coated with a metal layer. The electronics apparatus also includes a packaged semiconductor device coupled to, and housed in, the socket by metal contacts of the packaged semiconductor device attached to the J-leads of the socket.

In one embodiment, the plastic overmolded on each of the plurality of contacts is a liquid crystal polymer (LCP).

In one embodiment, the metal coated on the plastic is copper.

In one embodiment, the plurality of contact strips forms a hexagonal array within the plastic housing, and each of the plurality of contact strips is in contact with an adjacent contact strip through the metal layer of the respective contact strip.

In one embodiment, each of the plurality of contact strips is supported the by wall features of the plastic housing.

In one embodiment, the socket is a shielding socket for the packaged semiconductor device.

What is claimed is:

1. A socket for a packaged semiconductor device, the socket comprising:
    a plastic housing comprising walls surrounding a cavity; and
    a plurality of contact strips disposed in the cavity and supported by one or more of the walls of the plastic housing, each of the plurality of contact strips comprising a plurality of contacts, and each of the plurality of contacts comprising:
        a vertical region overmolded with plastic, the plastic coated with a metal layer;
        a contact portion; and
        a J-lead portion.

2. The socket of claim 1, wherein the plastic overmolded on each of the plurality of contacts is a liquid crystal polymer (LCP).

3. The socket of claim 1, wherein the metal coated on the plastic is copper.

4. The socket of claim 1, wherein the plurality of contact strips forms a hexagonal array within the plastic housing, and wherein each of the plurality of contact strips is in contact with an adjacent contact strip through the metal layer of the respective contact strip.

5. The socket of claim 1, wherein each of the plurality of contact strips is supported the by wall features of the plastic housing.

6. A contact strip for a shielded socket, the contact strip comprising:
    a plurality of contacts, each of the plurality of contacts comprising:
        a vertical region overmolded with plastic, the plastic coated with a metal layer;
        a contact portion; and
        a J-lead portion, wherein the plurality of contacts is unified by the plastic of each of the plurality of contacts, and wherein the plastic of each of the plurality of contacts of the contact strip has a unified undulating geometry.

7. The contact strip of claim 6, wherein the plastic overmolded on each of the plurality of contacts is a liquid crystal polymer (LCP).

8. The contact strip of claim 6, wherein the metal coated on the plastic is copper.

9. An electronics apparatus, comprising:
    a socket, comprising:
        a plastic housing comprising walls surrounding a cavity; and
        a plurality of contact strips disposed in the cavity and supported by one or more of the walls of the plastic housing, each of the plurality of contact strips comprising a plurality of contacts, and each of the plurality of contacts comprising a vertical region overmolded with plastic, the plastic coated with a metal layer, a contact portion, and a J-lead portion; and
    a packaged semiconductor device coupled to, and housed in, the socket by metal lands of the packaged semiconductor device attached to the contact portions of the socket.

10. The electronics apparatus of claim 9, wherein the plastic overmolded on each of the plurality of contacts is a liquid crystal polymer (LCP).

11. The electronics apparatus of claim 9, wherein the metal coated on the plastic is copper.

12. The electronics apparatus of claim 9, wherein the plurality of contact strips forms a hexagonal array within the plastic housing, and wherein each of the plurality of contact strips is in contact with an adjacent contact strip through the metal layer of the respective contact strip.

13. The electronics apparatus of claim 9, wherein each of the plurality of contact strips is supported the by wall features of the plastic housing.

14. The electronics apparatus of claim 9, wherein the socket is a shielding socket for the packaged semiconductor device.

\* \* \* \* \*